US007671695B2

(12) United States Patent
Han et al.

(10) Patent No.: US 7,671,695 B2
(45) Date of Patent: Mar. 2, 2010

(54) PARALLEL COUPLED CPW LINE FILTER

(75) Inventors: Sang-Min Han, Hwaseong-si (KR); Young-hwan Kim, Hwaseong-si (KR); Mi-hyun Son, Seoul (KR); Bong-su Kwon, Seoul (KR); Seong-sik Myoung, Goyang-si (KR); Jong-gwan Yook, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 192 days.

(21) Appl. No.: 11/544,582

(22) Filed: Oct. 10, 2006

(65) Prior Publication Data

US 2007/0159276 A1 Jul. 12, 2007

(30) Foreign Application Priority Data

Jan. 9, 2006 (KR) ...................... 10-2006-0002443

(51) Int. Cl.
*H01P 3/08* (2006.01)
*H01P 1/203* (2006.01)
*H03H 7/38* (2006.01)

(52) U.S. Cl. .......................... 333/33; 333/204; 333/238

(58) Field of Classification Search ................... 333/33, 333/124, 125, 131, 238, 113, 202, 204
See application file for complete search history.

(56) References Cited

U.S. PATENT DOCUMENTS

| | | | | |
|---|---|---|---|---|
| 5,832,376 | A * | 11/1998 | Henderson et al. | 455/327 |
| 5,990,765 | A * | 11/1999 | Mansour et al. | 333/204 |
| 6,262,640 | B1 * | 7/2001 | Tsujiguchi | 333/204 |
| 6,611,181 | B2 * | 8/2003 | Marketkar et al. | 333/24 R |
| 7,276,995 | B2 * | 10/2007 | Hamada et al. | 333/204 |
| 7,378,924 | B2 * | 5/2008 | Koizumi et al. | 333/204 |
| 7,397,331 | B2 * | 7/2008 | Koizumi et al. | 333/219 |

FOREIGN PATENT DOCUMENTS

| | | |
|---|---|---|
| JP | 7-263923 A | 10/1995 |
| JP | 2005-223392 A | 8/2005 |

* cited by examiner

*Primary Examiner*—Dean O Takaoka
(74) *Attorney, Agent, or Firm*—Sughrue Mion, PLLC

(57) ABSTRACT

A parallel coupled CPW line filter is provided, including a first and a second coupled lines arranged on one side of an insulating body and connected in parallel with each other, and a ground arranged on the same plane as the first and the second coupled lines, comprising a pair of ground parts spaced apart from the first and the second coupled lines, respectively, the ground parts each comprising recesses sunken from areas close to the first and the second coupled lines.

11 Claims, 8 Drawing Sheets

(a)

(b)

PARALLEL COUPLED CPW LINE FILTER

CROSS-REFERENCE TO RELATED APPLICATIONS

This application claims priority from Korean Patent Application No. 10-2006-002443, filed Jan. 9, 2006, in the Korean Intellectual Property Office, the entire disclosure of which is hereby incorporated by reference.

BACKGROUND OF THE INVENTION

Field of the Invention

Apparatuses consistent with the present invention relate to a parallel coupled CPW line filter. More particularly, the present invention relates to a parallel coupled CPW line filter which facilitates fabrication, reduces cost of fabrication and achieves miniaturization.

SUMMARY OF THE INVENTION

A parallel coupled line filter is generally used in the designing of a microwave integrated circuit, and has less than approximately 15% of the bandwidth. A strong coupling is required between the coupled lines and the ground to increase bandwidth of the parallel coupled line filter, and to this end, gaps between the coupled lines are shortened, the width of the coupled line itself is reduced, or the number of coupled lines is increased. However, the method of reducing the gaps between the coupled lines or the method of reducing the width of the coupled line requires a complicated fabrication process and increased cost. The method of increasing the number of coupled lines also results in a bulky size of the filter.

In order to make up for the above shortcomings, a parallel coupled line filter having an aperture 40 and usable with the Ultra Wide Band (UWB) has been suggested (FIG. 1).

As shown in FIG. 1, the parallel coupled line filter with the aperture 40 has a pair of parallel coupled lines 20 arranged on one side of an insulating body 30, and a ground 10 formed on the other side of the insulating body 30 at a distance H.

The aperture 40 is formed on one side of the ground 10, and the is formed opposite to the pair of coupled lines 20.

Due to the presence of the aperture 40, as shown in FIGS. 2A and 2B, the distance between the coupled lines 20 and the ground 10 increases.

Meanwhile, the coupling C between the coupled lines 20 and the ground 10 can be acquired by the following mathematical expression, where $Z_{0e}$ is the impedance when the electric current flows along the coupled lines 20 in the same direction, and $Z_{0o}$ is the impedance when the electric current flows along the coupled lines 20 in opposite directions.

$$C = \frac{Z_{0_e} - Z_{0_o}}{Z_{0_e} + Z_{0_o}} \quad \text{[Mathematical expression 1]}$$

When the electric current flows along the coupled lines 20 in the same direction, an equivalent circuit is formed as shown in FIG. 2A, with the capacitors $C_{11}$, $C_{22}$ between the coupled lines 20 and the ground 10, respectively. Because the capacitors $C_{11}$, $C_{22}$ are spaced apart from each other, the overall capacitance $C_e$ equals to those of each capacitor $C_{11}$, $C_{22}$. Therefore, $C_e=C_{11}=C_{22}$.

When the electric current flows along the coupled lines 20 in opposite directions as shown in FIG. 2B, electromagnetic field is formed between the coupled lines 20. Therefore, in an equivalent circuit, two more capacitors $2C_{12}$ are formed than when the electric current flows in the same direction. The overall capacitance $C_o$ is, $C_o=C_{11}+2C_{12}=C_{22}+2C_{12}$.

Meanwhile, the impedance $Z_{oe}$ is $$\frac{1}{vC_e},$$

and is $$\frac{1}{vC_o},$$

the impedance $Z_{oe}$ increases as the distance between the coupled lines 20 and the ground 10 increases, and accordingly, the coupling C therebetween is strengthened.

As explained above, the parallel coupled line filter having the aperture 40 provides the advantage of improved coupling between the coupled lines 20. However, if the position of the coupled lines 20 does not accurately match with the aperture 40 of the ground 10, performance deteriorates. Additionally, because the insulating body 30 has a thickness which adjusts the distance between the coupled lines 20 and the ground 10, miniaturization is difficult.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention seeks to overcome some of the problems of the related art. Accordingly, the present invention provides a parallel coupled CPW line filter which enables an easy fabrication with a reduced cost, and miniaturization.

According to an aspect of the present invention, there is provided a parallel coupled Co-planer waveguide (CPW) line filter, including a first and a second coupled lines arranged in parallel on one side of an insulating body, and a ground forming a coupling with the first and the second coupled lines, and arranged on the same plane as the first and the second coupled lines.

The ground may include a pair of ground parts arranged around the first and the second coupled lines and spaced apart from the first and the second coupled lines, respectively.

The pair of ground parts each may include recesses sunken from areas close to the first and the second coupled lines by a specified depth.

The first and the second coupled lines may be extended from opposite ends of the insulating body and bent a plurality of times in a substantially zigzag fashion between the pair of ground parts.

Heads of the first and the second lines facing each other may be spaced apart from each other by a particular distance and arranged in parallel.

The length of the first and the second coupled lines may be λ/4.

A pair of supplementary coupled lines may be also provided, which are bent in a substantially zigzag fashion in the same direction as the first and the second coupled lines, and arranged in parallel with the first and the second coupled lines.

One of the first and the second coupled lines and one of the supplementary coupled lines may be connected with each other by a connecting part of an area.

The total length of one of the first and the second coupled lines, one of the supplementary coupled lines, and the connecting part may be $\lambda/2$.

An open stub may also be provided, which comprises a vertical strip elongated from the connecting part along the lengthwise direction of the first and the second coupled lines, and a horizontal strip arranged at one end of the vertical strip.

The open stub may comprise a pair of symmetrical open stubs with respect to the connecting part.

According to an aspect of the present invention, there is provided a parallel coupled CPW line filter, including a first and a second coupled lines arranged on one side of an insulating body and arranged in parallel with each other, and a ground arranged on the same plane as the first and the second coupled lines, including a pair of ground parts spaced apart from the first and the second coupled lines, respectively, the ground parts each including recesses sunken from areas close to the first and the second coupled lines.

According to another aspect of the present invention, there is provided a parallel coupled CPW line filter, including a first and a second coupled lines arranged on one side of an insulating body in parallel with each other, and extended from opposite ends of the insulating body and bent a plurality of times in a substantially zigzag fashion crossing the lengthwise direction, and a ground arranged on the same plane as the first and the second coupled lines, including a pair of ground parts spaced apart from the first and the second coupled lines, respectively, the ground parts each including recesses sunken from areas close to the first and the second coupled lines.

BRIEF DESCRIPTION OF THE DRAWING FIGURES

The above and other aspects of the present invention will be more apparent by describing certain exemplary embodiments of the present invention with reference to the accompanying drawings, in which.

DETAILED DESCRIPTION OF THE EXEMPLARY EMBODIMENTS OF THE INVENTION

Figure 1:
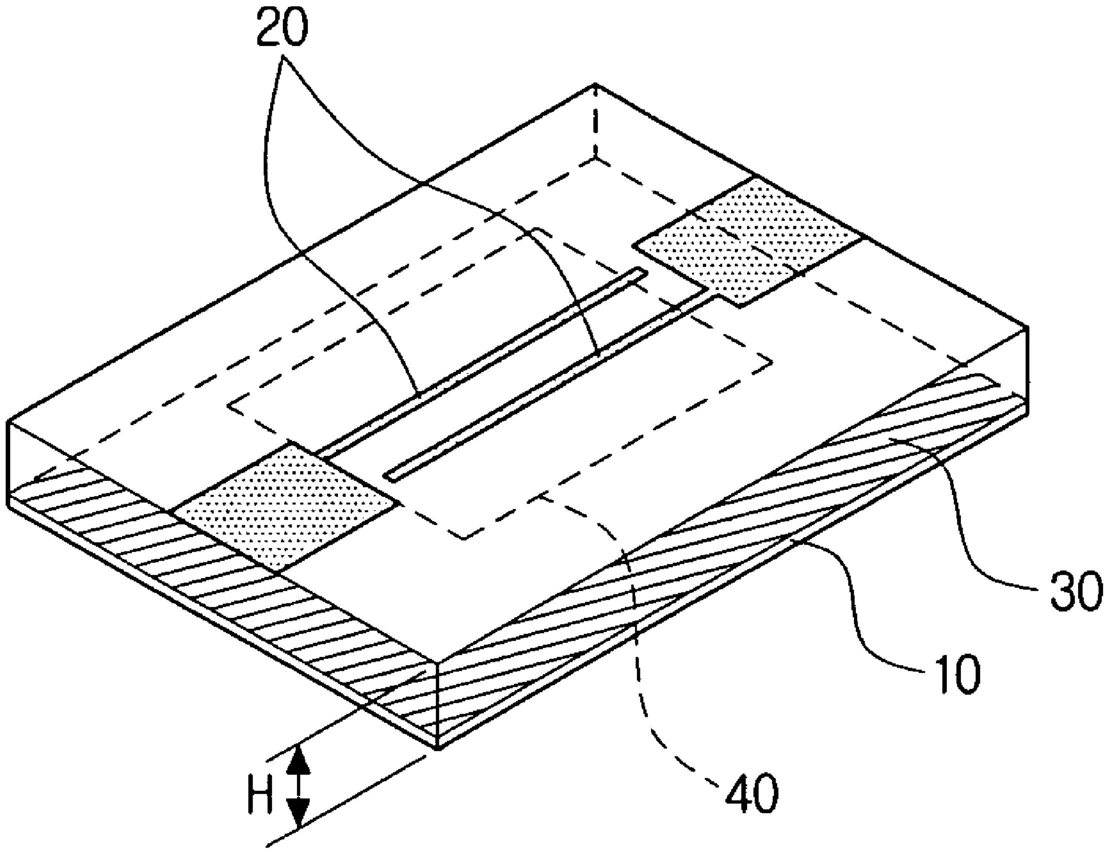
FIG. 1 (RELATED ART)
FIG. 1 is a perspective view of a related parallel coupled line filter having an aperture.
Figure 2A:
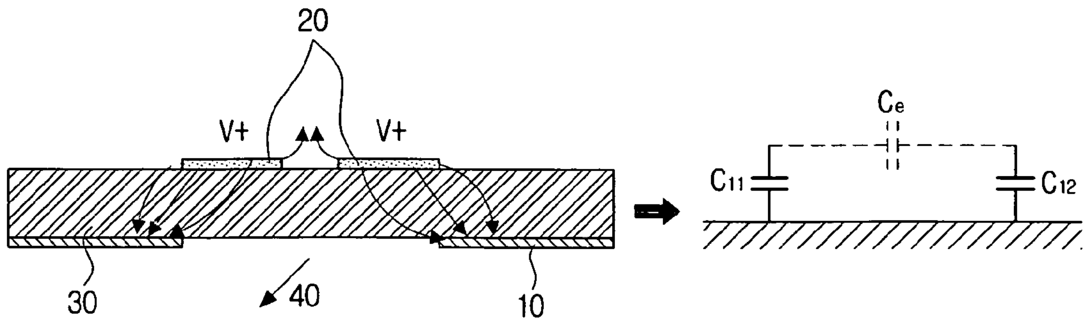
FIG. 2A (RELATED ART)
FIG. 2A shows a sectional view and an equivalent circuit diagram when electric current flows along the parallel coupled line filter of FIG. 1 in the same direction.
Figure 2B:
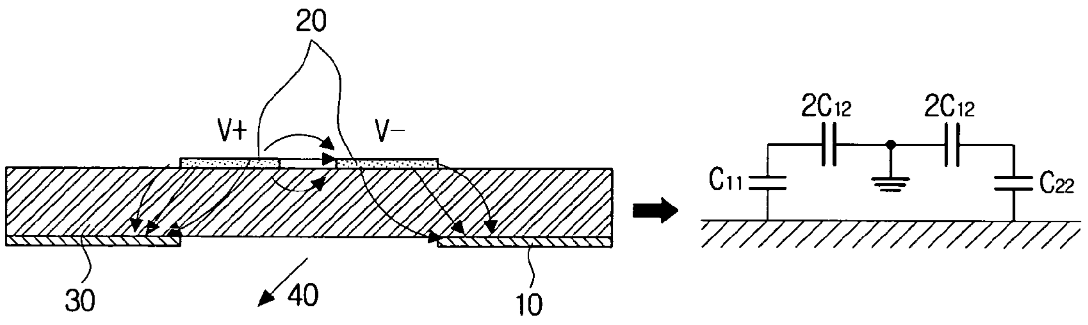
FIG. 2B (RELATED ART)
FIG. 2B shows a sectional view and an equivalent circuit diagram when electric current flows along the parallel coupled line filter of FIG. 1 in opposite directions.

Certain exemplary embodiments of the present invention will now be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 3:
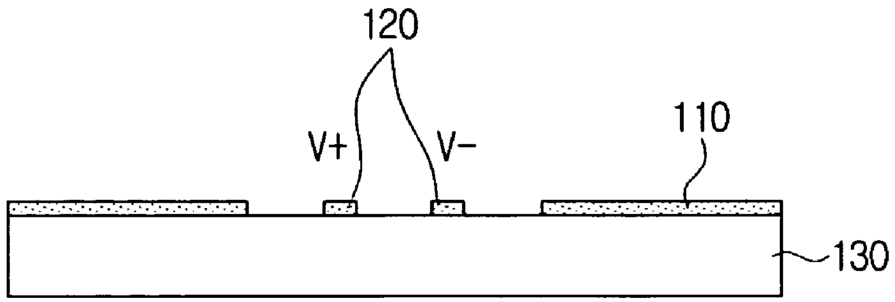
FIG. 3A is a sectional view of a parallel coupled CPW line filter according to a first exemplary embodiment of the present invention.
FIG. 3B is a plan view of the parallel coupled CPW line filter of FIG. 3A.
Figure 3:
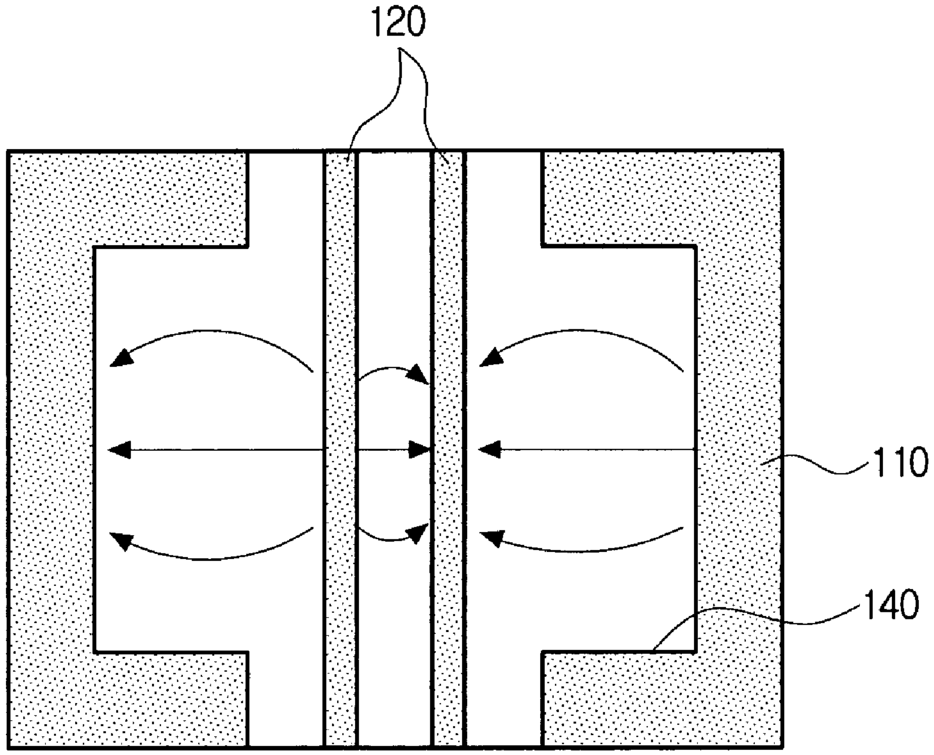

FIG. 3A is a sectional view of a parallel coupled CPW line filter according to a first exemplary embodiment of the present invention, and FIG. 3B is a plan view of the parallel coupled CPW line filter of FIG. 3A.

The parallel coupled CPW line filter according to one exemplary embodiment of the present invention includes a platelike insulating body 130, a pair of coupled lines 120 formed on one side of the platelike insulating body 130, and a ground 110 arranged on the same side as the coupled lines 120.

The coupled lines 120 are extended from one end to the other of the insulating body 130 across the center area, in parallel, and are spaced apart from each other.

The ground 110 applies the coplanar waveguide method. Therefore, the ground 110 is formed on the same side as the coupled lines 120, and divided into two parts which are arranged alongside the coupled lines 120. The ground parts 110 has recesses 140 sunken from the side facing the coupled lines 120, and due to the presence of the recesses 140, the distance between the ground 110 and the coupled lines 120 is increased.

As explained above, the impedance $Z_{oe}$ increases as the distance between the coupled lines 120 and the ground 110 increases when the electric current flows in the same direction, and according to mathematical expression 1, the coupling between the coupled lines 120 and the ground 110 is strengthened as the impedance $Z_{oe}$ increases.

The problem such as the complicated and expansive fabrication associated with the method of forming the coupled lines 120 on one side and forming the ground 110 on the other side, can be prevented by forming the coupled lines 120 and the ground 110 on the same side, because it is no longer necessary to accurately align the coupled lines 120 and the ground 110.

Figure 4:
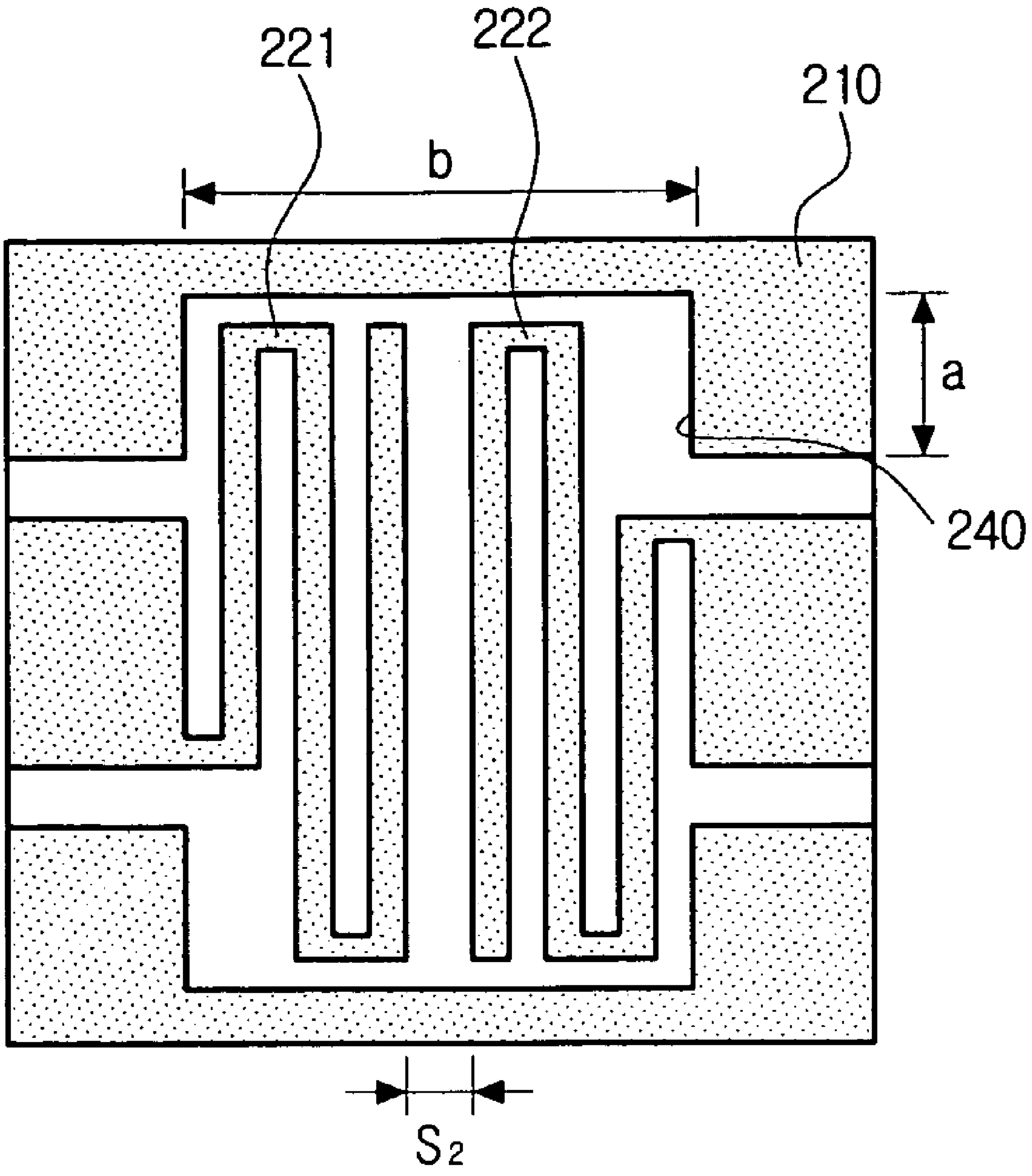
FIG. 4 is a plan view of a parallel coupled CPW line filter according to a second exemplary embodiment of the present invention.

FIG. 4 is a plan view of a parallel coupled CPW line filter according to a second exemplary embodiment of the present invention.

The parallel coupled CPW line filter includes an insulating body (not shown), a first and a second coupled lines 221, 222 formed on one side of the insulating body and bent a plurality of times, and a ground 210 formed on the same plane as the first and the second coupled lines 221, 222.

The first and the second coupled lines 221, 222 are extended from one end of the insulating body, and bent in a substantially zigzag fashion in the lengthwise direction. The head of the first coupled line 221 facing the second coupled line 222, and the head of the second coupled line 222 facing the first coupled line 221 are in parallel and are spaced apart from each other by a distance $S_2$.

By bending the first and the second coupled lines 221, 222 a plurality of times into a meander line, the overall size of the parallel coupled CPW line filter can be reduced, while maintaining the length of the first and the second coupled lines 221, 222 at λ/4, which is the same as FIGS. 3A and 3B.

The ground 210 includes a pair of ground parts arranged alongside the coupled lines 221, 222, and have recesses 240 sunken from the area facing the first and the second coupled lines 221, 222 at a distance. Due to the presence of the recesses 240, the ground parts 210 are formed substantially in '⊏' configuration, which surrounds the first and the second coupled lines 221, 222. The coupling between the coupled lines 221, 222 and the ground 210 can be adjusted by varying the horizontal width 'b' and the vertical width 'a' of the recesses 240.

Figure 5:
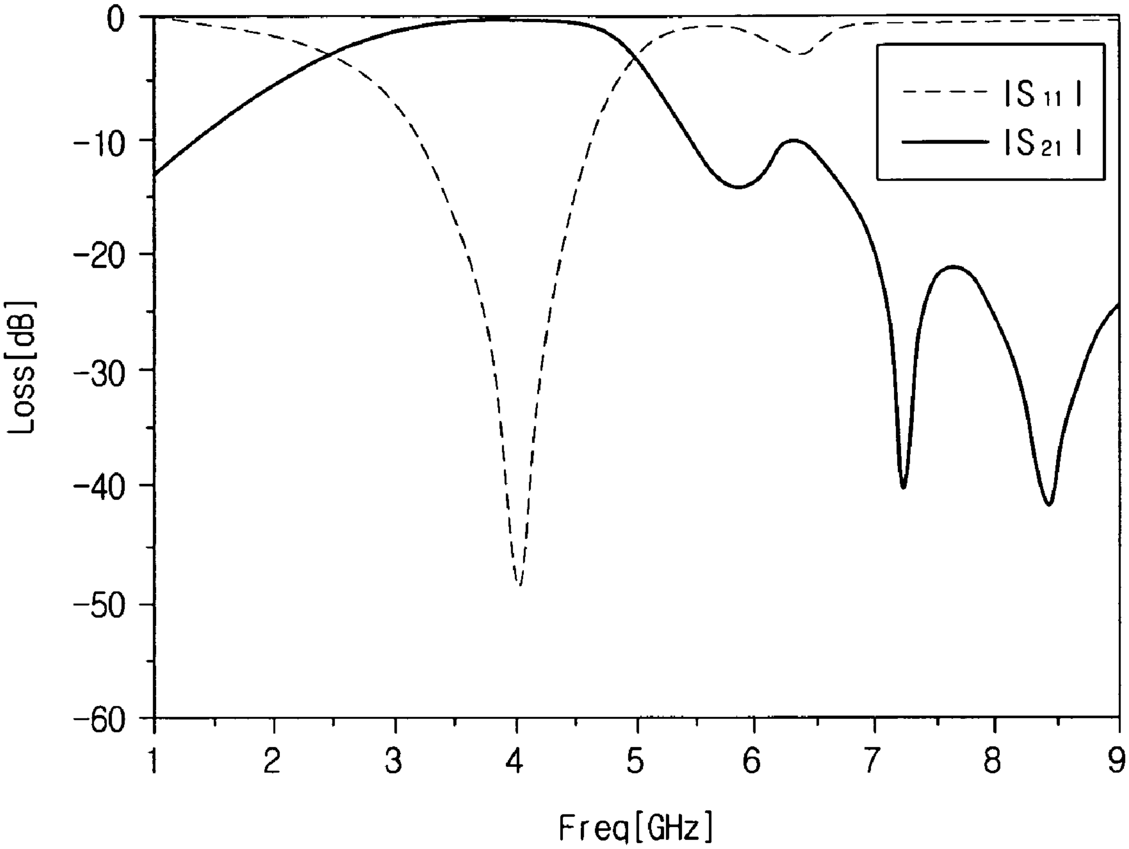
FIG. 5 is a graphical expression of losses of the parallel coupled CPW line filter of FIG. 4.

FIG. 5 is a graphical expression of losses of the parallel coupled CPW line filter of FIG. 4.

According to S11 of the parallel coupled CPW line filter according to the second exemplary embodiment of the present invention, there is a pole formed around the center band of 4 GHz, and from about 3.1 GHz to about 5.1 GHz of bandwidth is formed at −10 dB as a part of the UWB band. Also according to S21, the corresponding communication band has the high return loss, so the signals are received efficiently from the antennas of the other devices. One will understand that the parallel coupled CPW line filter according to the second exemplary embodiment is designed adaptively to the UWB communications.

Meanwhile, the pole of the operating frequency has to be formed where the normalized J-inverter is '1' in order for the filter to operate.

Figure 6:
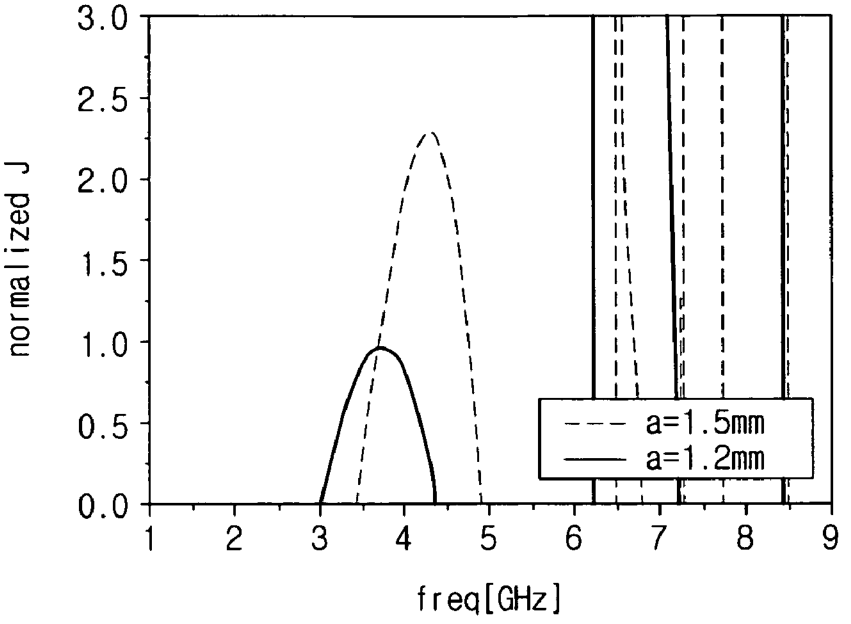
FIG. 6 is a graphical expression of a normalized J-inverter of the parallel coupled CPW line filter of FIG. 4.

FIG. 6 is a graphical expression showing the values of the normalized J-inverter corresponding to when the length 'a' is 1.2 mm and 1.5 mm in the parallel coupled CPW line filter of FIG. 4. As shown, pole is formed in both cases and therefore, the parallel coupled CPW line filter can operate normally.

Figure 7:
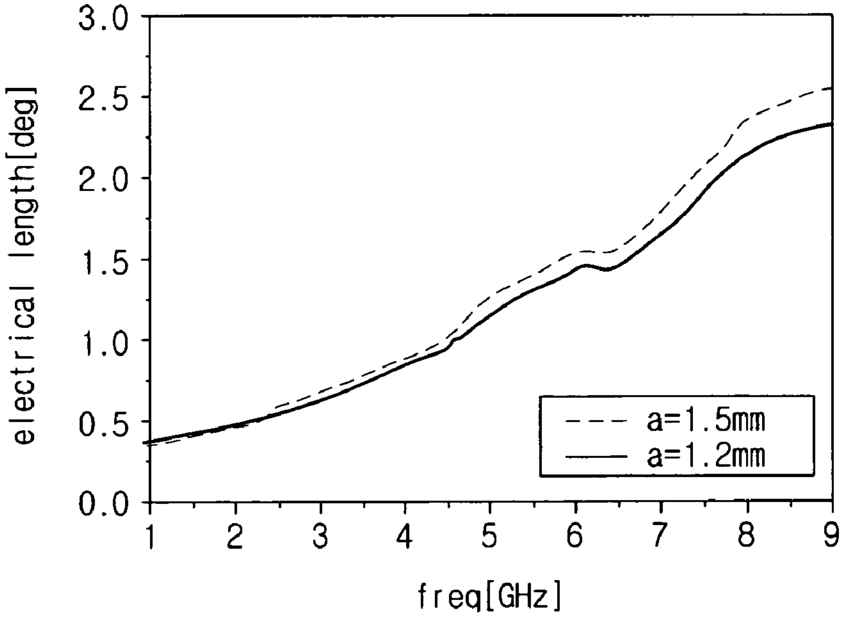
FIG. 7 is a graphical expression illustrating the relations between the length of the first and the second coupled lines and the frequency band in the parallel coupled CPW line filter of FIG. 4.

FIG. 7 is a graphical expression illustrating the relations between the length of the first and the second coupled lines and the frequency band in the parallel coupled CPW line filter of FIG. 4.

In order to operate as a filter, bandwidth has to be formed at a frequency where the electrical length of the first and the second coupled lines 221, 222 is approximately 90 degrees, that is, λ/4.

As shown, the parallel coupled CPW line filter of FIG. 4 has a bandwidth of 4 GHz approximately, which is the center frequency of from 3.1 GHz to 5.1 GHz of an UWB band, when the electrical length of the first and the second coupled lines 221, 222 is 90 degrees. Accordingly, the parallel coupled CPW line filter of FIG. 4 can operate for UWB communications.

Figure 8:
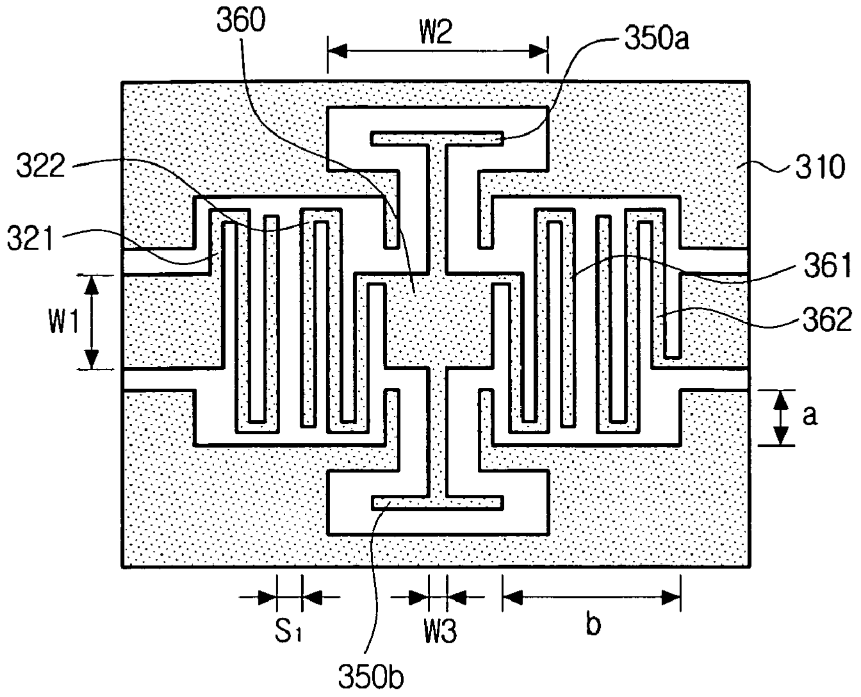
FIG. 8 is a plan view of a parallel coupled CPW line filter according to a third exemplary embodiment of the present invention.

FIG. 8 is a plan view of a parallel coupled CPW line filter according to a third exemplary embodiment of the present invention.

The parallel coupled CPW line filter according to the third exemplary embodiment of the present invention includes a first and a second coupled lines 321, 322, a third and a fourth coupled lines 361, 362 as the supplementary lines, a pair of open stubs 350*a*, 350*b*, and a ground 310.

The first and the second coupled lines 321, 322, and the third and the fourth coupled lines 361, 362 are formed in the substantially same configuration as the first and the second coupled lines 221, 222 of the second exemplary embodiment explained above, and they are arranged in parallel and spaced apart at a distance $S_1$.

Figure 9:
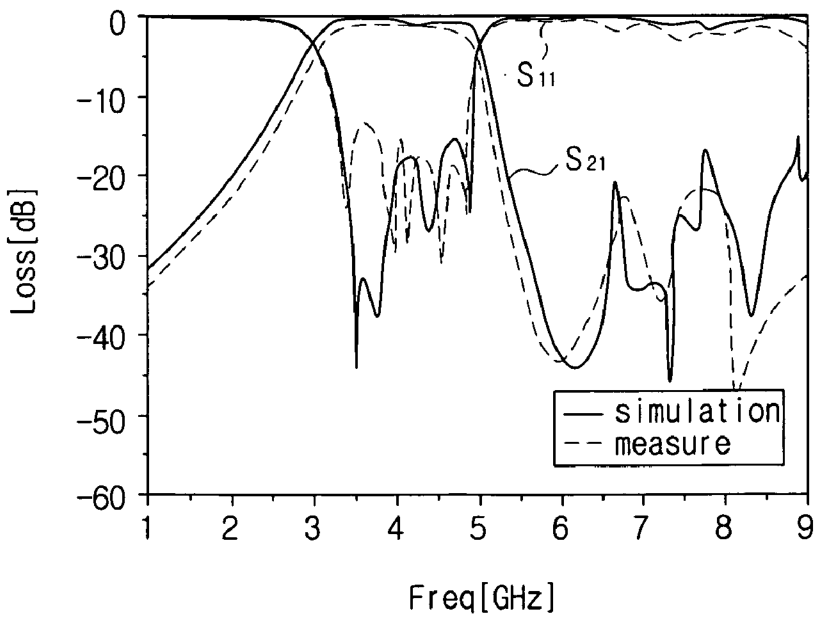
FIG. 9 is a graphical expression illustrating losses of the parallel coupled CPW line filter of FIG. 8.

A connecting part 360 is formed between the second and the third coupled lines 322, 361. That is, the second and the third coupled lines 322, 361 are connected with each other through the connecting part 360. The total length of the second and the third coupled lines 322, 361 and the connecting part 360 is λ/2 and a pole appears, by the second and the third coupled lines 322, 361 and the connecting part 360, at the first and the second λ/2 frequencies. As a result, four poles appear as shown in the graphical illustration of FIG. 9. Because there are a plurality of poles, return loss decreases and the filter performance is improved.

Each of the open stubs 350*a*, 350*b* has a substantially letter 'T' configuration, which includes a vertical strip elongated from the connecting part 360 and between the second and the third coupled lines 322, 361 having a length W1 and a width W3, and a horizontal strip elongated at an end of the vertical strip having a length W2. The open stubs 350*a*, 350*b* are formed by the sides of the connecting part 360, and correspond in position with each other. The open stubs 350*a*, 50*b* operate to remove harmonic. The 'harmonic' refers to the repeated formation of the bandwidth at a frequency which is a multiple of the bandwidth having the first harmonic. The harmonic has to be removed to achieve accurate formation of bandwidth.

Figure 10:
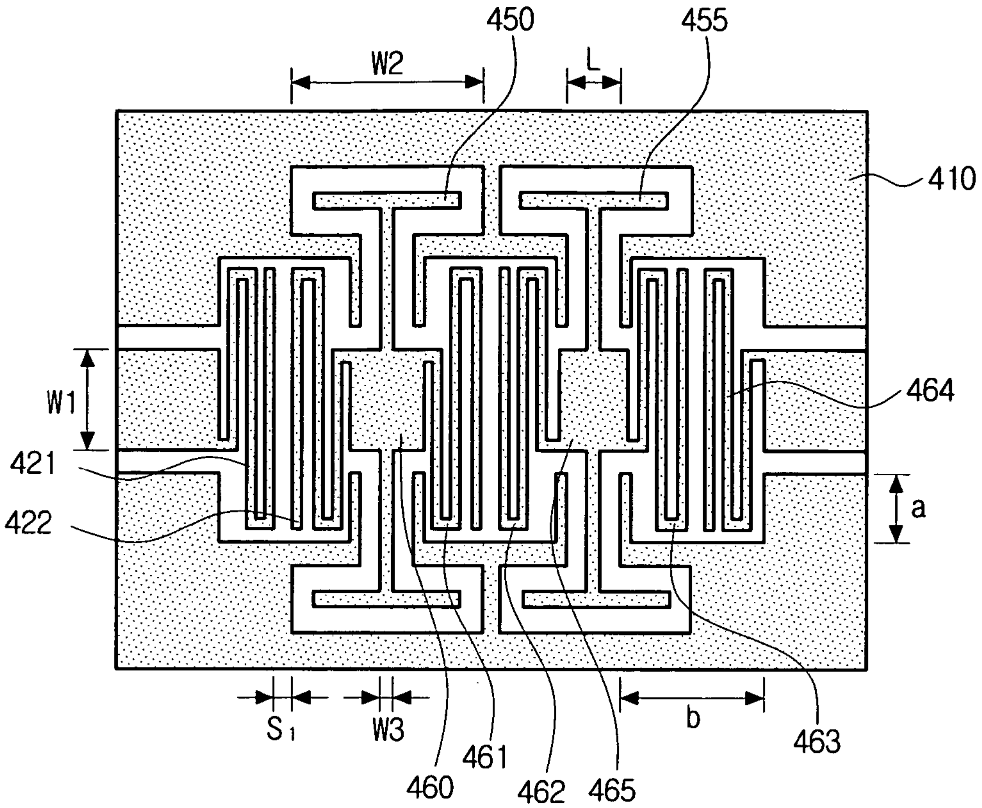
FIG. 10 is a plan view of a parallel coupled CPW line filter according to a fourth exemplary embodiment of the present invention.

FIG. 10 is a plan view of a parallel coupled CPW line filter according to a fourth exemplary embodiment of the present invention.

The parallel coupled CPW line filter according to the fourth exemplary embodiment includes a first and a second coupled lines 421, 422, a third and a fourth coupled lines 461, 462, a fifth and a sixth coupled lines 463, 464, a pair of open stubs 450, 455 and a ground 410.

Figure 11:
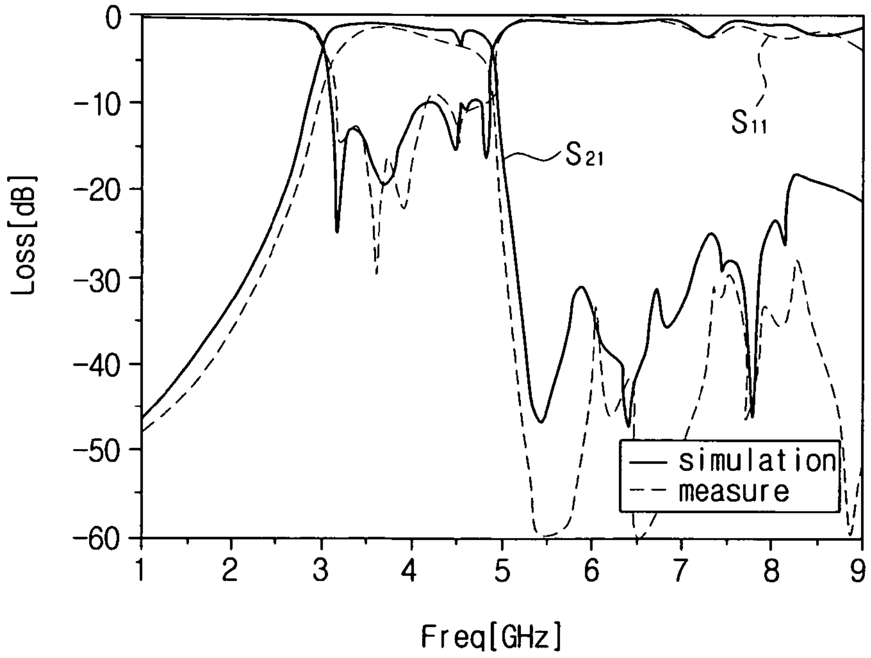
FIG. 11 is a graphical expression of losses of the parallel coupled CPW line filter of FIG. 10.

As explained in the third embodiment, the second and the third coupled lines 422, 461 and the connecting part 460, and the fourth and the fifth coupled lines 462, 463 and the connecting part 465 generate two poles in cooperation with each other. Compared to the third embodiment which uses the second and the third coupled lines 322, 361 and the connecting part 360, the fourth embodiment has a higher skirt property $S_{21}$ as shown in FIG. 11 by using the second and the third coupled lines 422, 461 and the connecting part 460, and the fourth and the fifth coupled lines 462, 463 and the connecting part 465.

As explained above, by forming a pair of coupled lines 120 and the ground 110 on the same plane, the parallel coupled CPW line filter according to an exemplary embodiment the present invention does not require the process of aligning the coupled lines 120 with the ground 110 during the fabrication process. As a result, fabrication becomes easier and cost can be reduced. Additionally, by bending the coupled lines 221, 222 a plurality of times, the size of the parallel coupled CPW line filter can be greatly reduced.

Furthermore, the skirt property can be increased by removing the harmonic by forming the open stubs 350, and generating multipoles by using the λ/2 length of coupled line.

As explained above, according to the exemplary embodiments of the present invention, fabrication of the parallel coupled CPW line filter is facilitated and at a reduced cost.

Additionally, the size of the filter can be greatly reduced, and the skirt property can be increased.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A parallel coupled CPW line filter, comprising:

a first and a second coupled lines arranged on one side of an insulating body and arranged in parallel with each other;

a ground arranged on the same plane as the first and the second coupled lines, comprising a pair of ground parts spaced apart from the first and the second coupled lines, respectively, the ground parts each comprising recesses sunken from areas close to the first and the second coupled lines, and a pair of supplementary coupled lines which are disposed in a same configuration as the first and the second coupled lines and arranged in parallel with the first and the second coupled lines, wherein the first and the second coupled lines are extended from opposite ends of the insulating body and bent a plurality of times in a substantially zigzag fashion between the pair of ground parts.

2. A parallel coupled CPW line filter, comprising:

a first and a second coupled lines arranged on one side of an insulating body in parallel with each other, and extended from opposite ends of the insulating body and bent a plurality of times in a substantially zigzag fashion crossing the lengthwise direction;

a ground arranged on the same plane as the first and the second coupled lines, comprising a pair of ground parts spaced apart from the first and the second coupled lines, respectively, the ground parts each comprising recesses sunken from areas close to the first and the second coupled lines, and a pair of supplementary coupled lines which are disposed in a same configuration as the first and the second coupled lines and arranged in parallel with the first and the second coupled lines.

3. A parallel coupled CPW line filter, comprising:

a first and a second coupled lines arranged in parallel on one side of an insulating body; a ground forming a coupling with the first and the second coupled lines, and arranged on the same plane as the first and the second coupled lines, and a pair of supplementary coupled lines which are disposed in a same configuration as the first and the second coupled lines and arranged in parallel with the first and the second coupled lines, wherein the ground comprises a pair of ground parts each comprising recesses sunken from areas close to the first and the second coupled lines, and wherein the first and the second coupled lines are extended from opposite ends of the insulating body and bent a plurality of times in a substantially zigzag fashion between the pair of ground parts.

4. The parallel coupled CPW line filter of claim 3, wherein the ground comprises a pair of ground parts arranged around the first and the second coupled lines which are spaced apart from the first and the second coupled lines, respectively.

5. The parallel coupled CPW line filter of claim 3, wherein heads of the first and the second lines facing each other are spaced apart from each other and arranged in parallel.

6. The parallel coupled CPW line filter of claim 5, wherein the length of the first and the second coupled lines is $\lambda/4$.

7. The parallel coupled CPW line filter of claim 6, wherein the pair of supplementary coupled lines bent in a substantially zigzag fashion in the same direction as the first and the second coupled lines, and arranged in parallel with the first and the second coupled lines.

8. The parallel coupled CPW line filter of claim 7, wherein one of the first and the second coupled lines and one of the supplementary coupled lines are connected with each other by a connecting area.

9. The parallel coupled CPW line filter of claim 8, wherein the total length of one of the first and the second coupled lines, one of the supplementary coupled lines, and the connecting area is $\lambda/2$.

10. The parallel coupled CPW line filter of claim 9, further comprising an open stub comprising a vertical strip elongated from the connecting area along the lengthwise direction of the first and the second coupled lines, and a horizontal strip arranged at one end of the vertical strip.

11. The parallel coupled CPW line filter of claim 10, wherein the open stub comprises a pair of symmetrical open stubs with respect to the connecting area.

* * * * *